United States Patent
Tsai et al.

[19]

[11] Patent Number: 6,022,775

[45] Date of Patent: Feb. 8, 2000

[54] HIGH EFFECTIVE AREA CAPACITOR FOR HIGH DENSITY DRAM CIRCUITS USING SILICIDE AGGLOMERATION

[75] Inventors: Chaochieh Tsai, Taichung; Mong-Song Liang, Hsin-Chu, both of Taiwan

[73] Assignee: Taiwan Semiconductor Manufacturing Company, Hsin-Chu, Taiwan

[21] Appl. No.: 09/135,043

[22] Filed: Aug. 17, 1998

[51] Int. Cl.[7] .............................................. H01L 21/8242
[52] U.S. Cl. ..................... 438/253; 438/255; 438/656; 438/964
[58] Field of Search ................................ 438/238–256, 438/393–399, 656, 651, 964

[56] References Cited

U.S. PATENT DOCUMENTS

| | | | |
|---|---|---|---|
| 5,110,752 | 5/1992 | Lu | 437/47 |
| 5,182,232 | 1/1993 | Chhabra et al. | 437/200 |
| 5,256,587 | 10/1993 | Jun et al. | 437/52 |
| 5,498,558 | 3/1996 | Kapoor | 437/43 |
| 5,583,070 | 12/1996 | Liao et al. | 437/52 |
| 5,930,625 | 7/1999 | Lin et al. | 438/253 |
| 5,960,280 | 9/1999 | Jeng et al. | 438/254 |

*Primary Examiner*—Jey Tsai
*Attorney, Agent, or Firm*—George O. Saile; Stephen B. Ackerman; Larry J. Prescott

[57] ABSTRACT

A method of forming a capacitor for use in DRAM or other circuits is described. A first polysilicon node, which will form the first capacitor plate, is formed on a layer of first oxide on an integrated circuit wafer. A layer of titanium silicide is formed on the first polysilicon node by depositing titanium and reacting the titanium with the polysilicon using a first rapid thermal anneal. The titanium silicide is then agglomerated by means of a second rapid thermal anneal thereby forming titanium silicide agglomerates on the surface of the first polysilicon node with exposed first polysilicon between the titanium silicide agglomerates. The exposed first polysilicon is then etched thereby increasing the surface area of the surface of the first polysilicon node and forming a first capacitor plate. A layer of second oxide is then formed on the first capacitor plate. A patterned layer of second polysilicon is then formed on the layer of second oxide forming a second capacitor plate.

20 Claims, 3 Drawing Sheets

HIGH EFFECTIVE AREA CAPACITOR FOR HIGH DENSITY DRAM CIRCUITS USING SILICIDE AGGLOMERATION

BACKGROUND OF THE INVENTION (1) Field of the Invention

This invention relates to methods of forming high capacitance capacitors for DRAM circuits and more specifically to the use of a first rapid thermal anneal to form titanium silicide and a second rapid thermal anneal to form titanium silicide agglomerates followed by selective etching of exposed polysilicon to increase the surface area of a capacitor plate.

(2) Description of the Related Art

U.S. Pat. No. 5,182,232 to Chhabra et al. describes a method of forming a texturized surface by annealing, oxidizing, and etching a layer of metal silicide that has been deposited on a semiconductive material. This method uses a first anneal to form metal silicide but does not use a second anneal.

U.S. Pat. No. 5,110,752 to Lu describes a method of forming a capacitor plate by depositing a refractory metal over a polysilicon layer. The composite is heated to form metal silicide and a roughened surface. The metal silicide is then removed to form a roughened surface to form a first capacitor plate. The method uses a first anneal but does not use a second anneal.

U.S. Pat. No. 5,256,587 to Jun et al. describes a method of forming a capacitor using hemispherical grain polysilicon for a first capacitor plate. The polysilicon surface with hemispherical grain polysilicon is selectively etched to increase the surface area.

U.S. Pat. No. 5,498,558 to Kapoor describes a method of forming an integrated circuit structure with a floating gate electrode. The method involves forming a thin layer of silicide forming metal over a polysilicon layer and heating sufficiently to react all the metal with polysilicon to form metal silicide and to coalesce the metal silicide into a discontinuous layer on the polysilicon. A capacitor is not formed.

U.S. Pat. No. 5,583,070 to Liao et al. describes a method of forming a capacitor using hemispherical grain polysilicon to increase the surface area of a capacitor plate.

SUMMARY OF THE INVENTION

Capacitors play an important role in many types of integrated circuit particularly in dynamic random access memory, DRAM, circuits. As the physical dimensions of these circuits become smaller it becomes increasingly difficult to fabricate capacitors that have sufficient capacitance.

It is a principle objective of this invention to provide a method of forming a capacitor in an integrated circuit structure having a large capacitance.

This objective is achieved by forming a polysilicon node on a layer of oxide formed on a wafer. The surface of the polysilicon node is made irregular in a controlled manner thereby increasing the surface area of the polysilicon node. A layer of oxide and a patterned layer of polysilicon complete the capacitor.

First a patterned layer of polysilicon is formed on a layer of first oxide formed on an integrated circuit wafer. The patterned layer of polysilicon forms a polysilicon node. A layer of titanium is then formed on the wafer. The titanium is then reacted with the polysilicon node using a first rapid thermal anneal forming a layer of titanium silicide, $TiSi_2$ on the polysilicon node. The unreacted titanium is then etched away.

The titanium silicide is then agglomerated using a second rapid thermal anneal forming agglomerates of titanium silicide and leaving exposed polysilicon between the agglomerates of titanium silicide. The exposed polysilicon is then etched thereby increasing the surface area of the polysilicon node and forming a first capacitor plate. A layer of second oxide is formed over the etched polysilicon node. A patterned layer of polysilicon is then formed over the layer of second oxide forming a second capacitor plate. The increased surface area of the polysilicon node forming the first capacitor plate provides increased capacitance for the capacitor. The increase in surface area can be controlled by the temperature of the second rapid thermal anneal.

DESCRIPTION OF THE PREFERRED EMBODIMENTS

Figure 1:
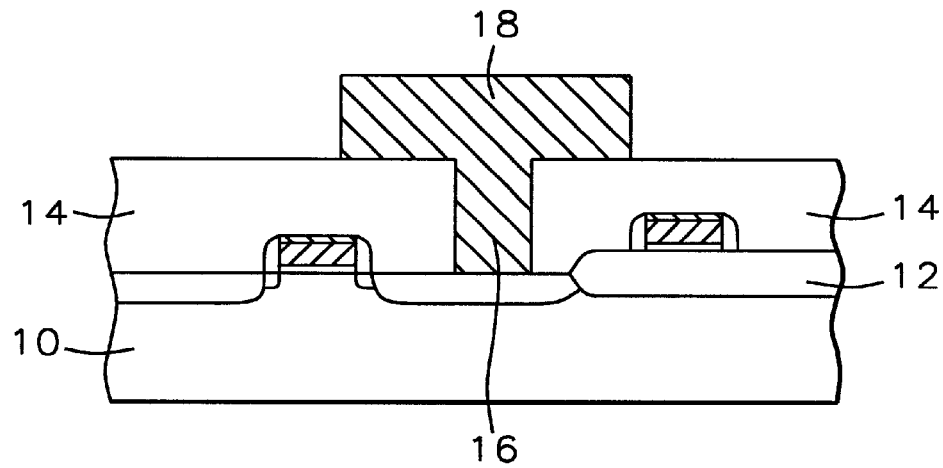
FIG. 1 shows a cross section of a wafer after forming a patterned layer of first polysilicon on a layer of first oxide.

Refer now to FIGS. 1–7 for a detailed description of the preferred embodiment of the method of this invention. A layer of first dielectric 14 is formed on a substrate 10. In this example the substrate 10 is a silicon integrated circuit wafer having devices formed therein. An isolation region 12 provides electrical isolation between circuits in the wafer. The first dielectric 14 is silicon oxide. The first dielectric 14 has a contact hole 16 formed therein where contact to the circuits in the wafer is made. A layer of first polysilicon is then deposited on the wafer, filling the contact hole 16 with first polysilicon, and patterned forming a first polysilicon node 18. The first polysilicon is deposited and patterned using standard methods well known to those skilled in the art.

Figure 2:
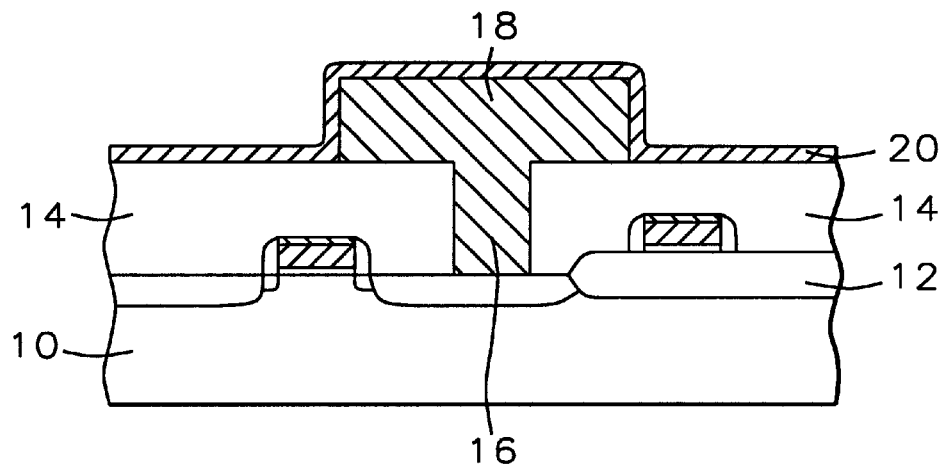
FIG. 2 shows a cross section of the wafer after a layer of titanium has been deposited.
Figure 3:
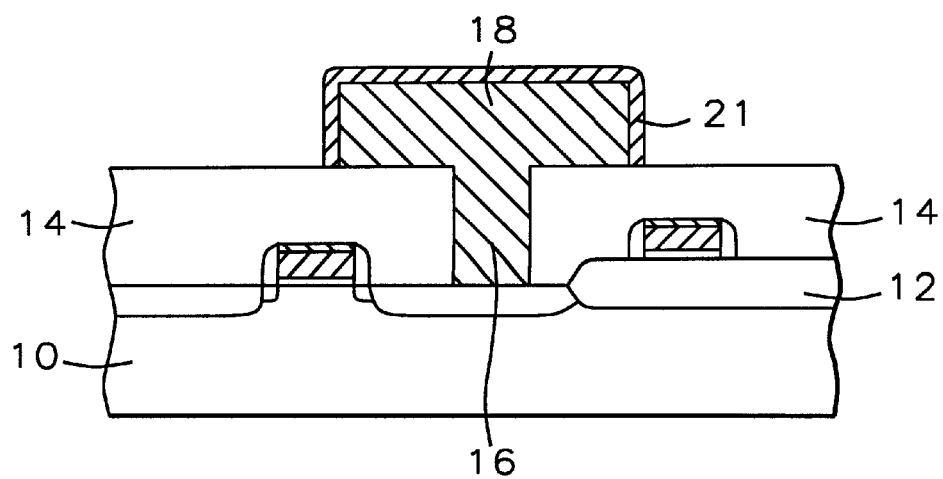
FIG. 3 shows a cross section of the wafer after a first rapid thermal anneal has reacted the titanium over the first polysilicon with the first polysilicon forming a layer of titanium silicide and the unreacted titanium has been etched away.

Next, as shown in FIG. 2, a layer of titanium 20 having a thickness of between about 160 and 240 Angstroms, is deposited on the wafer covering the first polysilicon node 18 using standard methods well known to those skilled in the art. The wafer with the layer of titanium is then annealed using rapid thermal processing at a temperature of between about 600° C. and 660° C. for between about 25 and 35 seconds. This rapid thermal anneal causes the titanium over the first polysilicon node to react with the first polysilicon forming a layer of titanium silicide, $TiSi_2$, 21 over the first polysilicon node 18. The unreacted titanium is then etched away using $NH_4OH/H_2O_2/H_2O$ in a 1:1:1 ratio as an etchant, see FIG. 3. The layer of titanium silicide 21 over the first polysilicon node 18 has a thickness of between about 160 and 240 Angstroms.

Figure 4:
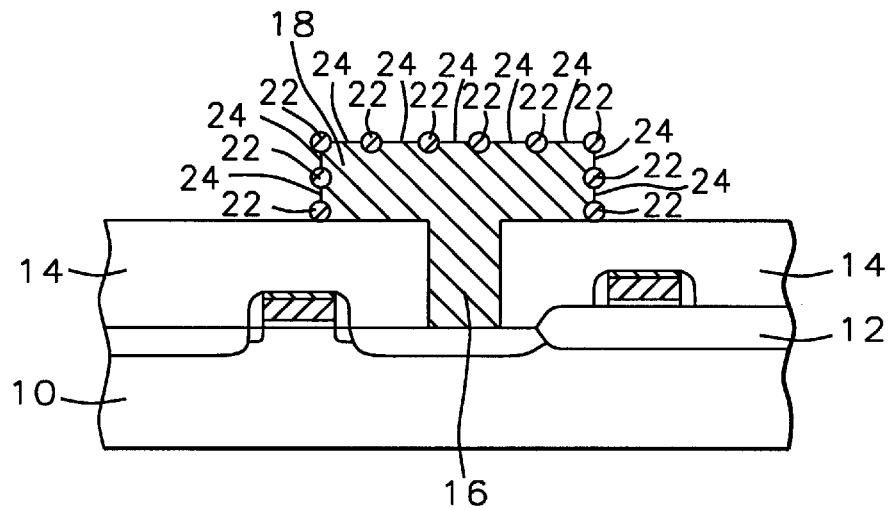
FIG. 4 shows a cross section of the wafer after a second rapid thermal anneal has agglomerated the titanium silicide leaving exposed first polysilicon.

The following process steps are unique to the method of this invention and are the key steps in the method of this invention. As shown in FIG. 4, the wafer is then subjected to a second anneal using rapid thermal processing. This second rapid thermal anneal uses a temperature of between about 950° C. and 1000° C. for between about 55 and 65 seconds. This second rapid thermal anneal causes the titanium silicide to agglomerate forming agglomerates 22 of titanium silicide and leaving exposed first polysilicon 24 between the agglomerates 22 of titanium silicide. The size of the agglomerates 22 of titanium silicide is controlled by the temperature of the second rapid thermal anneal.

Figure 5:
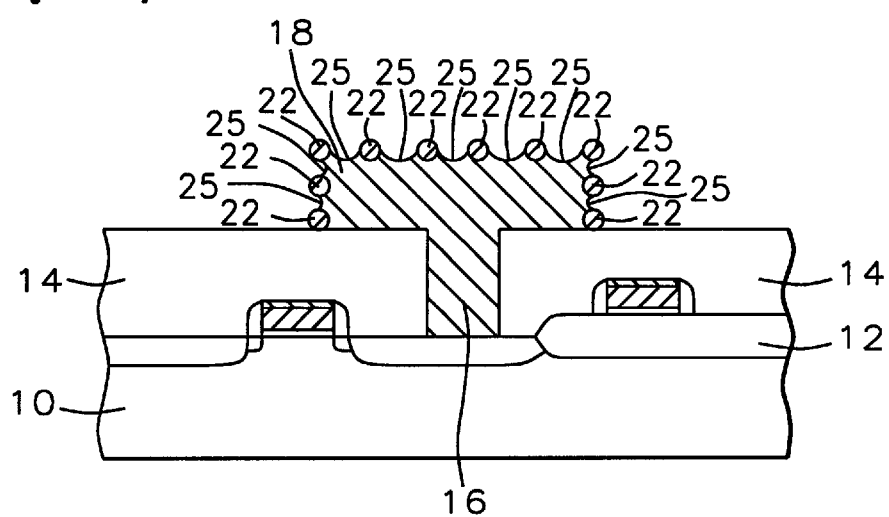
FIG. 5 shows a cross section of the wafer after the exposed first polysilicon has been etched.

As shown in FIG. 5, the exposed first polysilicon is then etched using the agglomerated titanium silicide 22 as a mask and a selective etching method, such as dry etching using a $NF_3$ plasma, which etches the exposed first polysilicon but not the titanium silicide. This selective etch forms cavities 25 in the surface of the polysilicon node 18 and increases the surface area of the first polysilicon node thereby forming a first capacitor plate. The increase in surface area of the first polysilicon node depends on the size of the titanium agglomerates 22 which is controlled by the temperature of the second rapid thermal anneal. Since the capacitance of the capacitor depends on the surface area of the first capacitor plate, the capacitance can be controlled by the temperature of the rapid thermal anneal.

Figure 6:
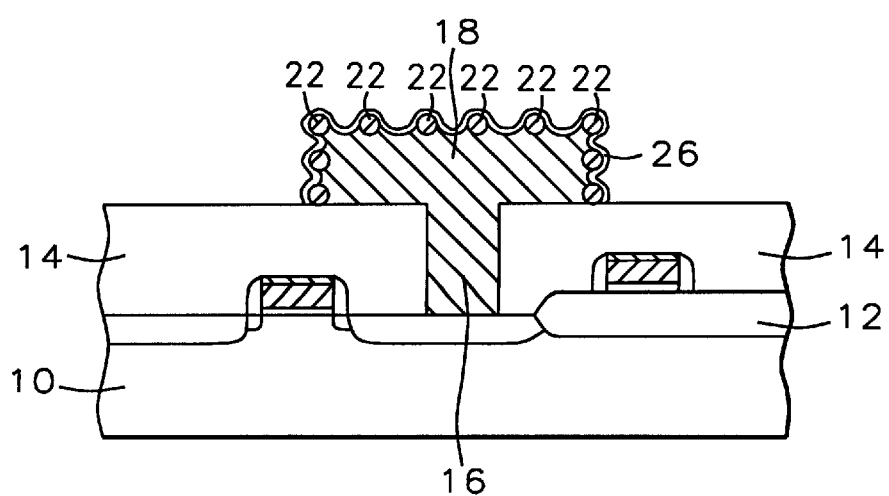
FIG. 6 shows a cross section of the wafer after a layer of second oxide has been formed over the etched first polysilicon.
Figure 7:
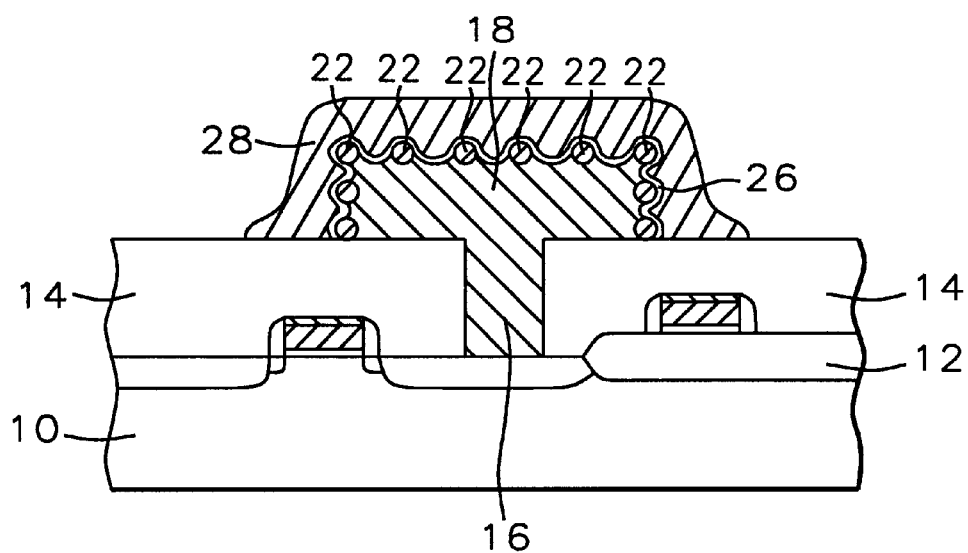
FIG. 7 shows a cross section of the wafer after a patterned layer of second polysilicon has been formed over the layer of second oxide forming a second capacitor plate.

As shown in FIG. 6, a layer of second dielectric 26 is then deposited on the wafer covering the first polysilicon node 18. In this example the layer of second dielectric is a layer of silicon oxide. As shown in FIG. 7, a layer of second polysilicon is then deposited on the wafer and patterned thereby forming a second capacitor plate 28 of second polysilicon. The second polysilicon is deposited and patterned using methods well known to those skilled in the art. The capacitor is then complete and desired contacts can be made to the second capacitor plate. The increased surface of the first capacitor plate 18 has provided increased capacitance for the capacitor. The increase in capacitance can be controlled by the temperature of the second rapid thermal anneal.

While the invention has been particularly shown and described with reference to the preferred embodiments thereof, it will be understood by those skilled in the art that various changes in form and details may be made without departing from the spirit and scope of the invention.

What is claimed is:

1. A method of forming a capacitor plate, comprising the steps of:

providing a substrate;

forming a layer of first dielectric on said substrate;

forming a contact hole in said layer of first dielectric;

forming a layer of first polysilicon on said layer of first dielectric thereby filling said contact hole in said layer of first dielectric with said first polysilicon;

patterning said layer of first polysilicon thereby forming a first polysilicon node over said contact hole;

depositing a layer of titanium on said substrate covering said first polysilicon node;

reacting that part of said layer of titanium on said first polysilicon node with said first polysilicon node by means of a first anneal thereby forming a layer of titanium silicide on said first polysilicon node;

etching away unreacted titanium after performing said first anneal;

forming agglomerated titanium silicide from said layer of titanium silicide by means of a second anneal thereby leaving exposed first polysilicon on the surface of said first polysilicon node;

etching said exposed first polysilicon on said surface of said polysilicon node using said agglomerated titanium silicide as a mask thereby increasing the surface area of said first polysilicon node and forming a first capacitor plate;

forming a layer of second dielectric on said first polysilicon node after etching said exposed first polysilicon on said surface of said first polysilicon node;

forming a layer of second polysilicon on said substrate wherein said layer of second polysilicon covers said layer of second dielectric; and patterning said layer of second polysilicon thereby forming a second capacitor plate on said layer of second dielectric.

2. The method of claim 1 wherein said first anneal comprises a first time and a first temperature.

3. The method of claim 2 wherein said first time is between about 25 and 35 seconds and said first temperature is between about 600° C. and 660° C.

4. The method of claim 1 wherein said second anneal comprises a second time and a second temperature.

5. The method of claim 4 wherein said second time is between about 55 and 65 seconds and said second temperature is between about 950° C. and 1000° C.

6. The method of claim 1 wherein said layer of titanium silicide has a thickness of between about 160 and 240 Angstroms.

7. The method of claim 1 wherein said layer of first polysilicon has a thickness of between about 2400 and 3600 Angstroms.

8. The method of claim 1 wherein said first dielectric is silicon oxide.

9. The method of claim 1 wherein said second dielectric is silicon oxide.

10. The method of claim 1 wherein said substrate is a silicon integrated circuit wafer having devices formed therein.

11. A method of forming a capacitor plate, comprising the steps of:

providing a substrate with a layer of first dielectric having a contact hole formed thereon;

forming a patterned layer of first polysilicon on said layer of first dielectric and in said contact hole;

depositing a layer of titanium on said substrate covering said patterned layer of first polysilicon;

reacting said titanium with said first polysilicon by means of a first anneal, thereby forming titanium silicide;

etching away unreacted titanium after performing said first anneal;

forming agglomerated titanium silicide from said reacted titanium using a second anneal thereby leaving exposed first polysilicon on the surface of said patterned layer of first polysilicon;

etching said exposed first polysilicon using said agglomerated titanium silicide as a mask thereby forming a first capacitor plate;

forming a layer of second dielectric on said first capacitor plate;

forming a layer of second polysilicon on said substrate covering said layer of second dielectric; and patterning said layer of second polysilicon thereby forming a second capacitor plate.

12. The method of claim 11 wherein said first anneal comprises a first time and a first temperature.

13. The method of claim 12 wherein said first time is between about 25 and 35 seconds and said first temperature is between about 600° C. and 660° C.

14. The method of claim 11 wherein said second anneal comprises a second time and a second temperature.

15. The method of claim 14 wherein said second time is between about 55 and 65 seconds and said second temperature is between about 950° C. and 1000° C.

16. The method of claim 11 wherein said layer of titanium silicide has a thickness of between about 160 and 240 Angstroms.

17. The method of claim 11 wherein said layer of first polysilicon has a thickness of between about 2400 and 3600 Angstroms.

18. The method of claim 11 wherein said first dielectric is silicon oxide.

19. The method of claim 11 wherein said second dielectric is silicon oxide.

20. The method of claim 11 wherein said substrate is a silicon integrated circuit wafer having devices formed therein.

* * * * *